United States Patent
Lee (10) Patent No.: US 9,595,529 B2
(45) Date of Patent: Mar. 14, 2017

(54) FUSE CELL CIRCUIT, FUSE CELL ARRAY AND MEMORY DEVICE INCLUDING THE SAME

(71) Applicant: SK hynix Inc., Gyeonggi-do (KR)

(72) Inventor: Kang-Seol Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/713,758

(22) Filed: May 15, 2015

(65) Prior Publication Data

US 2016/0181260 A1 Jun. 23, 2016

(30) Foreign Application Priority Data

Dec. 19, 2014 (KR) .................. 10-2014-0184202

(51) Int. Cl.
| | |
|---|---|
| *G11C 17/18* | (2006.01) |
| *G11C 17/16* | (2006.01) |
| *H01L 27/112* | (2006.01) |
| *H01L 23/525* | (2006.01) |
| *G11C 29/00* | (2006.01) |

(52) U.S. Cl.
CPC ........ *H01L 27/11206* (2013.01); *G11C 17/16* (2013.01); *G11C 17/18* (2013.01); *G11C 29/785* (2013.01); *H01L 23/5256* (2013.01)

(58) Field of Classification Search
CPC ...... G11C 17/16; G11C 29/027; G11C 29/787
See application file for complete search history.

(56) References Cited

U.S. PATENT DOCUMENTS

| | | | | |
|---|---|---|---|---|
| 7,254,078 B1* | 8/2007 | Park | .............. | G11C 17/18 365/200 |
| 8,351,291 B2* | 1/2013 | Lee | .............. | G11C 17/18 365/100 |
| 8,542,549 B2* | 9/2013 | Lin | .............. | G11C 17/16 365/225.7 |
| 8,780,604 B2* | 7/2014 | Liao | .............. | G11C 17/16 365/225.7 |
| 2016/0035439 A1* | 2/2016 | Huang | .............. | G11C 17/16 365/96 |

FOREIGN PATENT DOCUMENTS

| | | |
|---|---|---|
| KR | 1020120052454 | 5/2012 |
| KR | 1020130122260 | 11/2013 |

* cited by examiner

*Primary Examiner* — Hoai V Ho
*Assistant Examiner* — Roberto Mancera
(74) *Attorney, Agent, or Firm* — IP & T Group LLP (57) ABSTRACT

A fuse cell circuit may include a bit line, a first fuse transistor having first and second program states, a first select transistor coupled between one terminal of the first fuse transistor and the bit line, and suitable for turning on when the first fuse transistor is selected, a second fuse transistor including one terminal coupled to the other terminal of the first fuse transistor, and having first and second program states, and a second select transistor coupled between a other terminal of the second fuse transistor and the bit line, and suitable for turning on when the second fuse transistor is selected.

12 Claims, 10 Drawing Sheets

FUSE CELL CIRCUIT, FUSE CELL ARRAY AND MEMORY DEVICE INCLUDING THE SAME

CROSS-REFERENCE TO RELATED APPLICATIONS

The present application claims priority of Korean Patent Application No. 10-2014-0184202 filed on Dec. 19, 2014, which is incorporated herein by reference in its entirety.

BACKGROUND

1. Field

This patent document relates to a fuse cell circuit, a fuse cell array, and a memory device including the same.

2. Description of the Related Art

Fuses can be programmed by cutting them with lasers. The data held in a fuse array is stored based on whether the fuses have been cut. Thus, fuses can be programmed while they are in the wafer stage, but not after the wafers are mounted in a package.

In order to overcome this disadvantage, an e-fuse may be used. An e-fuse stores data by changing resistance states between the gate and the drain/source of a transistor.

Figure 1:
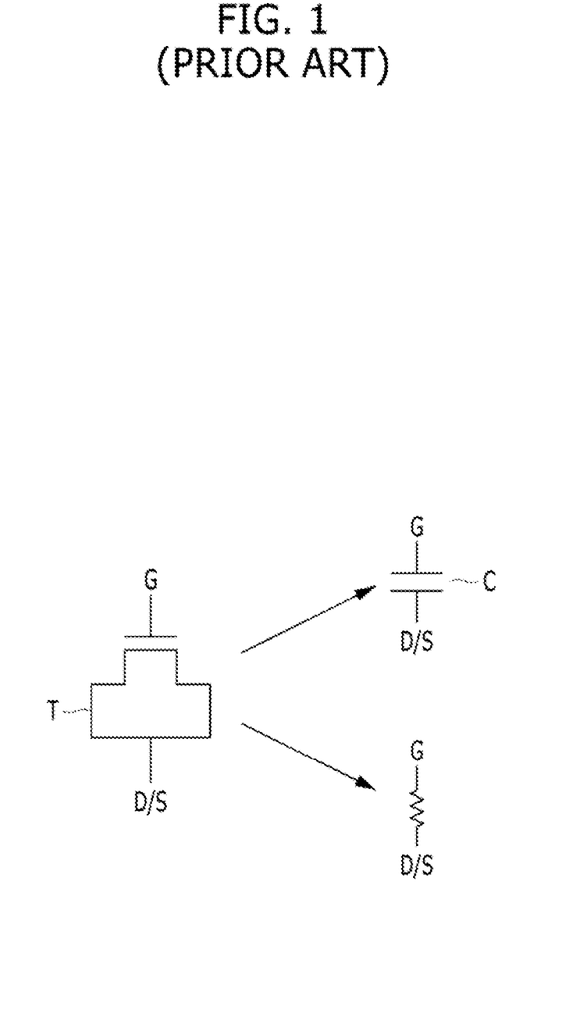
FIG. 1 is a diagram illustrating an e-fuse that includes a transistor and operates as a resistor or capacitor.

FIG. 1 is a diagram illustrating an e-fuse that includes a transistor and operates as a resistor or a capacitor.

Referring to FIG. 1, the e-fuse includes a transistor T, which is configured to receive a power supply voltage through a gate G thereof and receive a ground voltage through a drain/source D/S thereof.

When a normal power supply voltage, which the transistor T can withstand, is applied to the gate G, the e-fuse operates as a capacitor C. Thus, no current flows between the gate G and the drain/source D/S. However, when a high power supply voltage, which the transistor T cannot withstand, is applied to the gate G, the gate G and the drain/source D/S may short-circuit as the gate oxide of the transistor T is destroyed. Then, the e-fuse operates as a resistor R. Thus, a current flows between the gate G and the drain/source D/S. Based on this phenomenon, the data stored in the e-fuse may be recognized by the amount of resistance present between the gate G and the drain/source D/S of the e-fuse. To recognize the data stored in an e-fuse, (1) the size of the transistor T may be increased to directly recognize the data without a separate sensing operation, or (2) an amplifier may be used to sense the current flowing in the transistor T without increasing the size of the transistor T. The two above-described methods are limited in terms of the area of an e-fuse, because the transistor T forming the e-fuse is large or there needs to be an amplifier for amplifying the data current.

Figure 2:
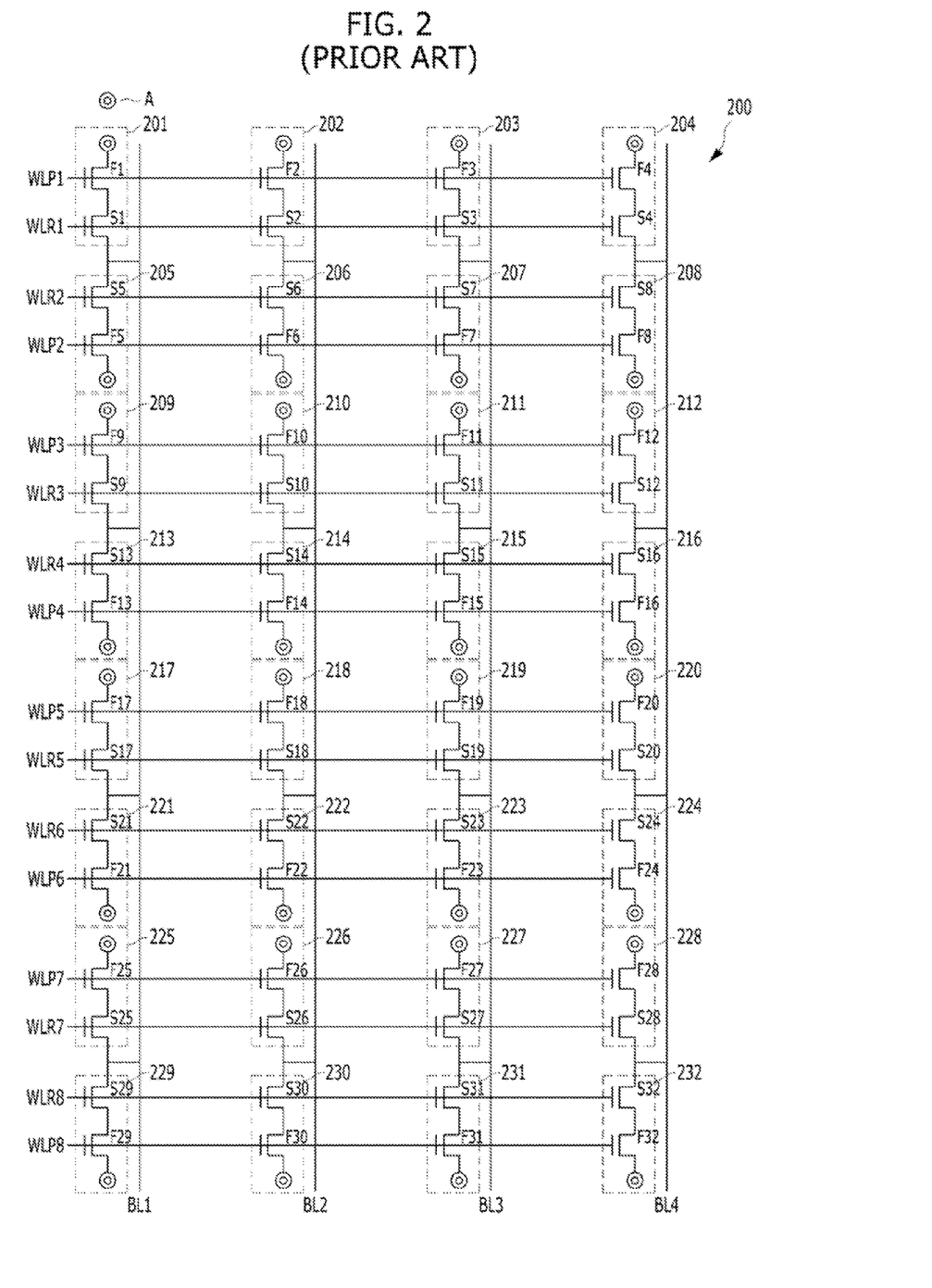
FIG. 2 is a configuration diagram of a fuse cell array including e-fuses.

FIG. 2 is a configuration diagram of a fuse cell array 200 including e-fuses.

Referring to FIG. 2, the fuse cell array 200 includes memory cells 201 to 232 arranged in a plurality of rows and columns (for example, eight rows and four columns in FIG. 2). The memory cells 201 to 232 include fuse transistors F1 to F32 and select transistors S1 to S32, respectively. The fuse transistors F1 to F32 are e-fuses which have the properties of a resistor or capacitor, depending on whether the e-fuses are ruptured. That is, the e-fuses F1 to F32 may act as resistive fuse transistors to store data based on the magnitude of resistance. The select transistors S1 to S32 electrically couple the fuse transistors F1 to F32 to column lines BL1 to BL4 under the control of row lines WLR1 to WLR8.

During a program operation, a selected row line is activated to turn on select transistors coupled thereto, and a high voltage applied to a selected program/read line. Furthermore, a low-level or high-level voltage is applied to a selected column line to program a selected fuse coupled thereto. When a low-level voltage is applied to the selected column line, the selected fuse ruptures.

During a read operation, a selected row line is activated to turn on select transistors coupled thereto, and a voltage suitable for the read operation is applied to a selected program/read line. Furthermore, a low-level voltage is applied to a selected column line to read data of a selected fuse coupled thereto. At this time, the data of the selected fuse may be recognized depending on whether current flows through the selected column line.

In FIG. 2, one terminal A of the fuse transistors F1 to F32 is isolated by an isolation layer (refer to 302 of FIG. 3) formed through an STI (Shallow Trench Isolation) process.

Figure 3:
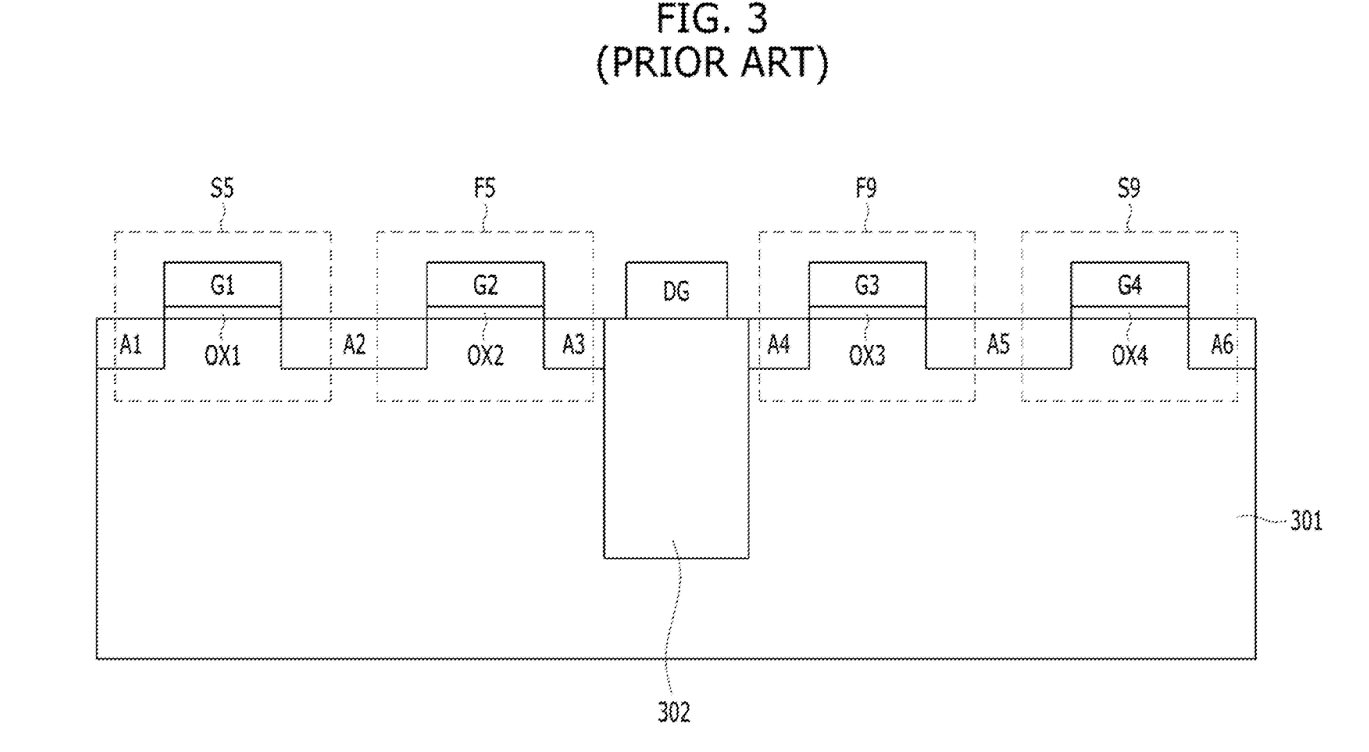
FIG. 3 is a cross-sectional view illustrating adjacent fuse cells formed over a substrate.

FIG. 3 is a cross-sectional view illustrating adjacent fuse cells 205 and 209 formed over a substrate.

Referring to FIG. 3, the fuse transistors F5 and F9 and the select transistors S5 and S9 may be formed over a semiconductor substrate 301. The transistors F5, F9, S5, and S9 may include active regions A1 to A5, gates G1 to G4, gate oxide layers OX1 to OX4 and the like.

In order to stably isolate the active regions A3 and A4, the isolation layer 302 may be formed between the active regions A3 and A4. Furthermore, a dummy gate DG may be formed over the isolation layer 302 to control the uniformity of the process. The existence of the isolation layer 302 may significantly increase the area consumed by the fuse cell array 200.

SUMMARY

Various embodiments are directed to a fuse cell circuit having reliability that is improved while the area thereof is reduced, and a fuse cell array and a memory device including the same.

In an embodiment, a fuse cell circuit may include a bit line, a first fuse transistor having first and second program states, a first select transistor coupled between one terminal of the first fuse transistor and the bit line, and suitable for turning on when the first fuse transistor is selected, a second fuse transistor including one terminal coupled to the other terminal of the first fuse transistor, and having the first and second program states, and a second select transistor coupled between the other terminal of the second fuse transistor and the bit line, and suitable for turning on when the second fuse transistor is selected.

In an embodiment, a fuse cell circuit may include a bit line, a semiconductor substrate doped with a first-type impurity, first to fifth active regions formed in one surface of the semiconductor substrate, separated from each other, and doped with a second-type impurity, wherein the first to fifth active regions are sequentially formed in parallel to the one surface of the semiconductor substrate, and the first and fifth active regions are coupled to the bit line, first to fourth gate oxide layers of which a Kth gate oxide layer is formed over and in contact with the semiconductor substrate between the Kth active region and the (K+1)th active region, where K is a natural number and 1≤K≤4, and first, to fourth gates formed over the first to fourth gate oxide layers, respectively. The second and third gate oxide layers may have first and second program states.

In an embodiment, a fuse cell array may include a plurality of bit lines, and a plurality of fuse cells each having both ends coupled to a corresponding bit line among the bit lines. Each of the fuse cells may include a first fuse transistor having first and second program states, a first select transistor coupled between one terminal of the first fuse transistor and the bit line, and suitable for turning on when the first fuse transistor is selected, a second fuse transistor including one terminal coupled to the other terminal of the first fuse transistor, and having the first and second program states, and a second select transistor coupled between the other terminal of the second fuse transistor and the bit line, and suitable for turning on when the second fuse transistor is selected.

In an embodiment, a memory device may include a nonvolatile memory unit including a plurality of bit lines and a plurality of fuse cells to store repair data, a plurality of latch units suitable for sequentially storing data outputted from the nonvolatile memory unit, and a memory bank suitable for replacing a normal cell with a redundancy cell using the data stored in the plurality of latch units. Each of the fuse cells may include a first fuse transistor having first and second program states, a first select transistor coupled between one terminal of the first fuse transistor and a corresponding bit line of the plurality of bit lines, and suitable for turning on when the first fuse transistor is selected, a second fuse transistor including one terminal coupled to the other terminal of the first fuse transistor, and having the first and second program states, and a second select transistor coupled between the other terminal of the second fuse transistor and the corresponding bit line, and suitable for turning on when the second fuse transistor is selected.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated to clearly illustrate features of the embodiments. When an element is referred to as being connected or coupled to another element, it should be understood that the former can be directly connected or coupled to the latter, or electrically connected or coupled to the latter via an intervening element therebetween. Furthermore, when it is stated that something "comprises" (or "includes") or "has" some elements, it should be understood that it may comprise (or include) or have only those elements, or it may comprise (or include) or have other elements as well as those elements, if there is no specific limitation. The terms of singular form may include plural forms unless stated otherwise.

Figure 4:
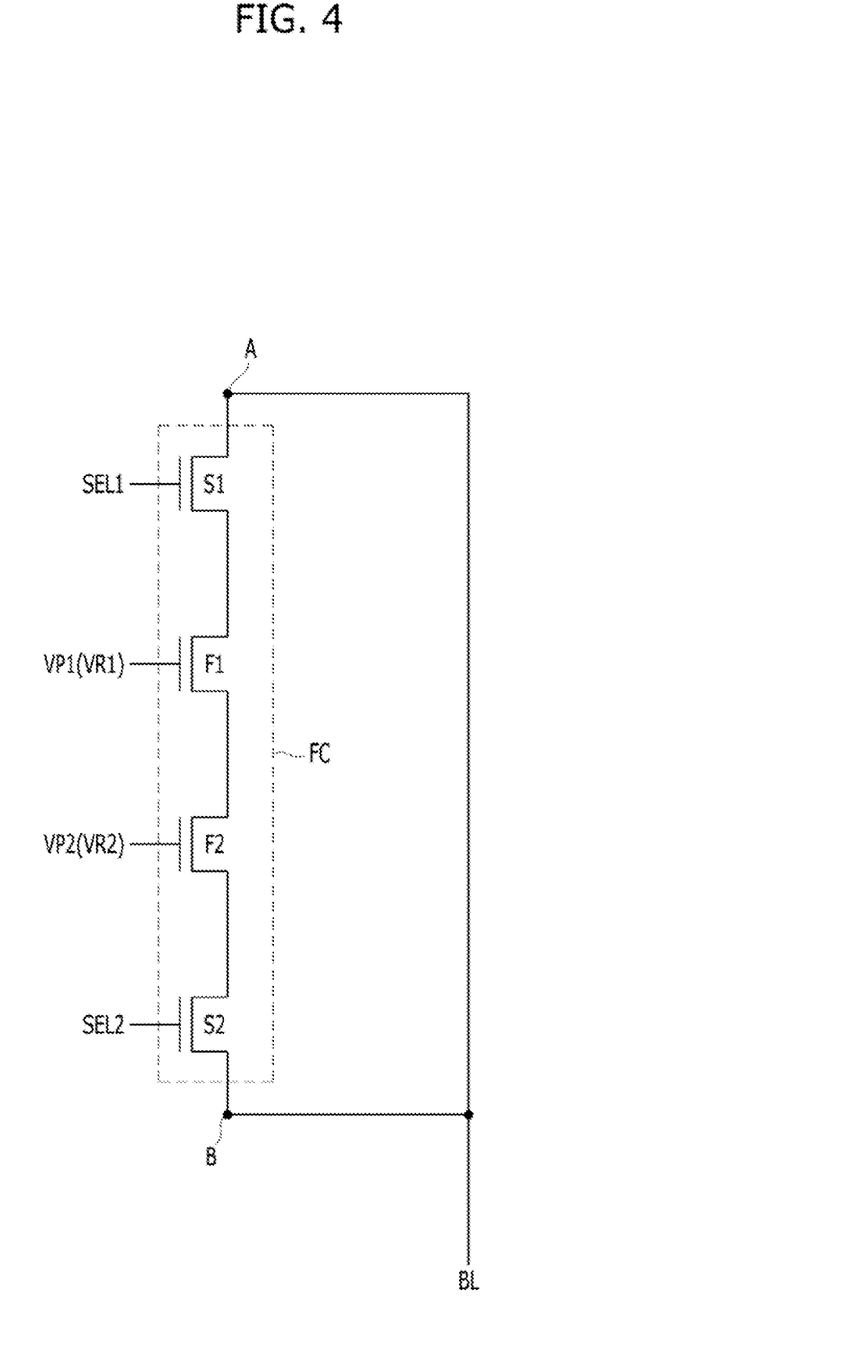
FIG. 4 is a configuration diagram of a fuse cell circuit in accordance with an embodiment of the present invention.

FIG. 4 is a configuration diagram of a fuse cell circuit in accordance with an embodiment of the present invention.

Referring to FIG. 4 the fuse cell circuit may include a bit line BL, fuse transistors F1 and F2, and select transistors S1 and S2. The fuse transistors F1 and F2 and the select transistors S1 and S2 may form a fuse cell FC to store data.

The transistors are coupled in series as the first select transistor S1, the first fuse transistor F1, the second fuse transistor F2, and the second select transistor S2. One terminal A of the first select transistor S1 and one terminal B of the select transistor S2 may be coupled to a bit line BL.

The first and second fuse transistors F1 and F2 may have a first program state or a second program state. The first program state may indicate a state in which a gate oxide layer is destroyed, as described with reference to FIG. 1. The second program state may indicate a state in which the gate oxide layer is not destroyed, as described with reference to FIG. 1. When the fuse transistors F1 and F2 have the first program state, values stored in the fuse transistors F1 and F2 may correspond to first program data (for example, '1'), and when the fuse transistors F1 and F2 have the second program state, the values stored in the fuse transistors F1 and F2 may correspond to second program data (for example, '0').

For a program operation, a first program voltage VP1 may be applied to the gate of the first fuse transistor F1, and a second program voltage VP2 may be applied to the gate of the second fuse transistor F2. Furthermore, for a read operation, a first read voltage VR1 may be applied to the gate of the first fuse transistor F1 and a second read voltage VR2 may be applied to the gate of the second fuse transistor F2.

The first and second select transistors S1 and S2 may be coupled between the respective fuse transistors F1 and F2 and the bit line BL, and turned on when respective select signals SEL1 and SEL2 are activated. When the select transistors S1 and S2 are turned on, the respective fuse transistors F1 and F2 may be programmed or the data stored in the respective fuse transistors F1 and F2 may be sensed through the bit line BL.

The fuse cell FC of FIG. 4 may store one-bit or two-bit data. Hereafter, the fuse cell FC will be described in both cases of storing one-bit and two-bit data.

(1) The First Case of Storing One-Bit Data

The fuse cell FC may store one-bit data depending on the states of the first and second fuse transistors F1 and F2. When one or more of the first and second fuse transistors F1 and F2 has or have the first program state, the one-bit data stored in the fuse cell FC may have first program data (for example, '1') and when both of the first and second fuse transistors F1 and F2 have the second program state, the one-bit data stored in the fuse cell FC may have second program data (for example, '0'). The first and second fuse transistors F1 and F2 may be selected together. Thus, the first and second select transistors S1 and S2 may be turned on together (the select signals SEL1 and SEL2 are the same signals).

During a program operation, the first and second select transistors S1 and S2 may turn on together, and the same program voltages may be applied to the first and second fuse transistors F1 and F2 (the program voltages VP1 and VP2 are the same voltages). When the first program data is stored in the fuse cell FC, the bit line BL may be driven to a low level, and when the second program data is stored in the fuse cell FC, the bit line BL may be driven to a high level.

During a read operation, the first and second select transistors S1 and S2 may be turned on together, and the same read voltages VR1 and VR2 may be applied to the first and second fuse transistors F1 and F2. When one or more of the first and second fuse transistors F1 and F2 has or have the first program state, current may flow through the bit line BL, and when both of the first and second fuse transistors F1 and F2 have the second program state, no current may flow through the bit line BL. When current flows through the bit line BL, it may be recognized that the first program data was stored in the fuse cell FC, and when no current flows through the bit line BL, it may be recognized that the second program data was stored in the fuse cell FC.

When one-bit data is stored in the first and second fuse transistors F1 and F2, the first program data may be properly recognized even though only the gate oxide layer of one fuse transistor between the two fuse transistors is destroyed when the first program data is stored.

(2) The Second Case of Storing Two-Bit Data

The fuse cell FC may store first one-bit data depending on the state of the first fuse transistor F1, and store second one-bit data depending on the state of the second fuse transistor F2. That is, each of the first and second fuse transistors F1 and F2 may store one-bit data depending on the state thereof. At this time, the first and second fuse transistors F1 and F2 may be separately selected. Thus, the first and second select transistors S1 and S2 may be turned on when the respective fuse transistors F1 and F2 are selected (the select signals SEL1 and SEL2 are different signals).

During a program operation, when the first fuse transistor F1 is programmed, the first select transistor S1 may be turned on, and the second select transistor S2 may be turned off. At this time, a high-level program voltage VPS, may be applied to the first fuse transistor F1, and a low-level program voltage VP2 may be applied to the second fuse transistor F2. When first program data is stored in the first fuse transistor F1, the bit line BL may be driven to a low level, and when second program data is stored in the first fuse transistor F1, the bit line BL may be driven to a high level.

During a read operation, when data of the first fuse transistor F1 is read, the first select transistor S1 may be turned on, and the second select transistor S2 may be turned off. At this time, a read voltage VR1 having a voltage suitable for the read operation may be applied to the first fuse transistor F1 and a read voltage VR2 having a low voltage may be applied to the second fuse transistor F2. When the first fuse transistor F1 has the first program state, a current may flow through the bit line BL, and when the first fuse transistor F1 has the second program state, no current may flow through the bit line BL. When current flows through the bit line BL, it may be recognized that the first program data was stored in the first fuse transistor F1, and when no current flows through the bit line BL, it may be recognized that the second program data was stored in the first fuse transistor F1.

The program and read operations of the second fuse transistor F2 may be performed in the same manner as described above. In this case, however, the second fuse transistor F2 may be selected instead of the first fuse transistor F, and the program voltage VP2 having a high voltage or the read voltage VR2 having a suitable voltage may be applied to the second fuse transistor F2.

Figure 5:
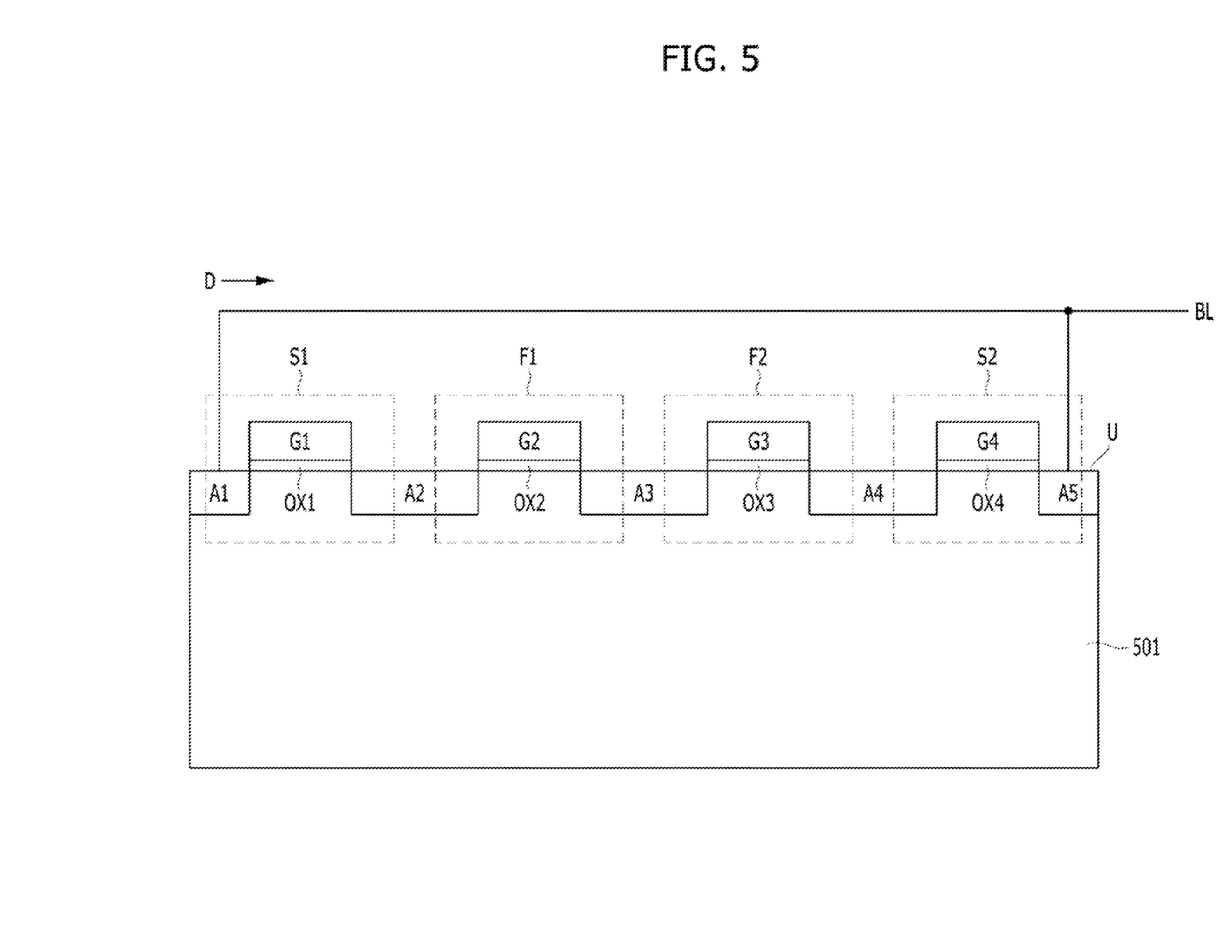
FIG. 5 is a cross-sectional view illustrating transistors included in the fuse cell circuit of FIG. 4, which are formed over a substrate.

FIG. 5 is a cross-sectional view illustrating the transistors F1, F2, S1 and S2 included in the fuse cell circuit of FIG. 4, which are formed over a substrate.

Referring to FIG. 5, the fuse cell circuit may include a semiconductor substrate 501, a bit line BL, first to fourth gates G1 to G4, first to fourth gate oxide layers OX1 to OX4, and first to fifth active regions A1 to A5.

The semiconductor substrate 501 may be a first-type semiconductor. The first-type semiconductor may include a P-type or N-type semiconductor. Hereafter it will be described as an example that the first-type semiconductor is a P-type semiconductor, that is, the semiconductor substrate 501 is doped with a P-type impurity.

At one surface U of the semiconductor substrate 501, the first to fifth active regions A1 to A5 may be sequentially formed in a direction D parallel to the surface U of the semiconductor substrate 501 so as to be separated from each other. The first to fifth active regions A1 to A5 may be a second-type semiconductor formed in predetermined regions of the semiconductor substrate 510. The second-type semiconductor may include an N-type or P-type semiconductor. Hereafter, it will be described as an example that the second-type semiconductor is an N-type semiconductor, that is, the active regions A1 to A5 are doped with an N-type impurity. The first and fifth active regions A1 and A5 positioned at both ends may be coupled to the bit line BL.

Each of the first to fourth gate oxide layers OX1 to OX4 may be formed between two active regions so as to be in contact with the semiconductor substrate 501. Among the first to fourth gate oxide layers OX1 to OX4, a Kth gate oxide layer may be formed over the semiconductor substrate 501 between a Kth active region and a (K+1)th active region, where K is a natural number and $1 \leq K \leq 4$. The first to fourth gates G1 to G4 may be formed over the respective gate oxide layers OX1 to OX4.

The first select transistor S1 may include the first active region A1, the first gate G1, the first gate oxide layer OX1 and the second active region A2. The first fuse transistor F1 may include the second active region A2, the second gate G2, the second gate oxide layer OX2 and the third active region A3. The second fuse transistor F2 may include the third active region A3, the third gate G3, the third gate oxide layer OX3, and the fourth active region A4. The second select transistor S2 may include the fourth active region A4, the fourth gate G4, the fourth gate oxide layer OX4, and the fifth active region A5. As illustrated in FIG. 5, each of the second to fourth active regions A2 to A4 may be shared by two different transistors.

The fuse cell circuit illustrated in FIGS. 4 and 5 may not require the isolation layer 302 for isolating transistors, and an active region within the fuse cell circuit may be shared by two transistors. Thus, the area of the fuse cell circuit may be reduced. Furthermore, since the transistors F1, F2, S1, and S2 have the same shape, unlike the fuse cell circuit illustrated in FIG. 3, the uniformity of the process may be increased to improve the reliability of the circuit.

Figure 6:
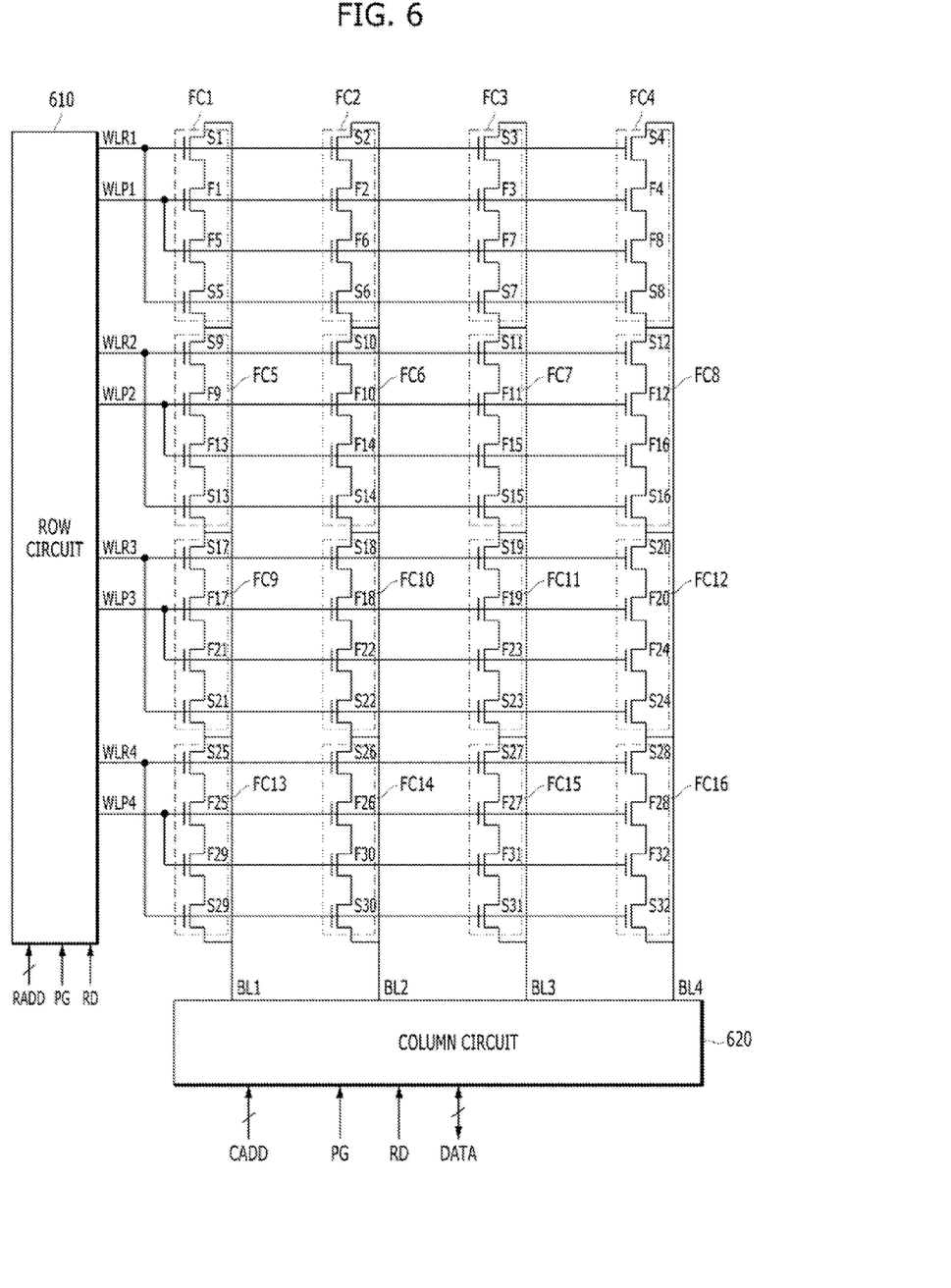
FIG. 6 is a configuration diagram of a fuse cell array in accordance with an embodiment of the present invention.

FIG. 6 is a configuration diagram of a fuse cell array in accordance with an embodiment of the present invention. In the fuse cell array of FIG. 6, each fuse cell may store one-bit data.

Referring to FIG. 6, the fuse cell array may include first to fourth bit lines BL1 to BL4, a plurality of row lines WLR1 to WLR4, a plurality of program/read lines WLP1 to WLP4, and a plurality of fuse cells FC1 to FC16. Each of the fuse cells FC1 to FC16 may have the same configuration as the fuse cell FC of FIG. 4. That is, each of the fuse cells FC1 to FC16 may include two fuse transistors and two select transistors.

In FIG. 6, the select transistors included in each of the fuse cells FC1 to FC16 may be coupled to the same row line, and the fuse transistors included in each of the fuse cells FC1 to FC16 may be coupled to the same program/read line. Each of the fuse cells FC1 to FC16 of FIG. 6 may store one-bit data depending on the states of the two fuse transistors. The one-bit data stored in each of the fuse cells FC1 to FC16 of FIG. 6 may have first program data (for example, '1') when one or more of the two fuse transistors has or have the first program state, or have second program data (for example, '0') when both of the two fuse transistors have the second program state.

A program signal PG may be activated during a program operation period, and a read signal RD may be activated during a read operation period. A row address RADD may include an address for selecting a row, and a column address CADD may include an address for selecting a column. Data DATA may include data programmed to the fuse cell array or data read from the fuse cell array.

The row circuit 610 may select a row corresponding to the row address RADD. The row circuit 610 may activate the row line WLR of the selected row, and deactivate the row line WLR of an unselected row. During a program operation in which the program signal PG is activated, the row circuit 610 may apply a high voltage to the program/read line WLP of the selected row, and apply a low-level voltage to the program/read line WLP of the unselected row. The high voltage may be generated by pumping a power supply voltage, and have a voltage high enough to destroy the gate oxide of a fuse transistor. Furthermore, during a read operation in which the read signal RD is activated, the row circuit 610 may apply a voltage suitable for the read operation (for example, power supply voltage) to the program/read line WLP of the selected row, and apply a low-level voltage (for example, ground voltage) to the program/read line WLP of the unselected row.

The column circuit 620 may select a column corresponding to the column address CADD. During a program operation, the column circuit 620 may drive the bit line BL of the selected column to a low level when input data DATA is the first program data (for example, '1'), and drive the bit line BL of the selected column to a high level when the input data DATA is the second program data (for example, '0'). The column circuit 620 may float the bit line BL of the unselected column. During a read operation, the column circuit 620 may sense and output data of the bit line BL of the selected column, depending on whether a current flows through the bit line BL of the selected column, and float the bit line BL of an unselected column.

Hereafter, it is described as an example that the first row is a selected row and the fourth column is a selected column, that is the fuse cell FC4 is a selected fuse cell. The voltages applied to the selected fuse cell FC4 and the unselected fuse cells FC1 to FC3 and FC5 to FC16 during program and read operations will be described as follows.

Program Operation

The row line WLR1 of the selected row may be activated, and the other row lines WLR2 to WLR4 may be deactivated. Thus, the select transistors S1 to S8 may be turned on, and the select transistors S9 to S32 may be turned off. At this time, a high voltage may be applied to the program/read line WLP1 of the selected row, and a low-level voltage (for example, ground voltage) may be applied to the other program/read lines WLP2 to WLP4.

When input data DATA is first program data (for example, '1'), the selected bit line BL4 may be driven to a low level, and the fuse transistors F4 and F8 of the selected fuse cell FC4 may be programmed with the first program data. Furthermore, when the input data DATA is second program data (for example, '0'), the selected bit line BL4 may be driven to a high level, and the fuse transistors F4 and F8 of the selected fuse cell FC4 may be programmed with the second program data. Since the unselected bit lines BL1 to BL3 are floated, the fuse transistors F1, F2, F3, F5, F6, and F7 may not be programmed even though a high voltage is applied to the gates thereof.

Read Operation

The row line WLR1 of the selected row may be activated, and the other row lines WLR2 to WLR4 may be deactivated. Thus, the select transistors S1 to S8 may be turned on, and the select transistors S9 to S32 may be turned off. At this time, a read voltage may be applied to the program/read line WLP1 of the selected row, and a low-level voltage may be applied to the other program/read lines WLP2 to WLP4. When current flows through the selected bit line BL4, the value stored in the fuse cell FC4 may be recognized as the first program data, and when no current flows through the selected bit line BL4, the value stored in the fuse cell FC4 may be recognized as the second program data. The unselected bit lines BL1 to BL3 may be floated.

Figure 7:
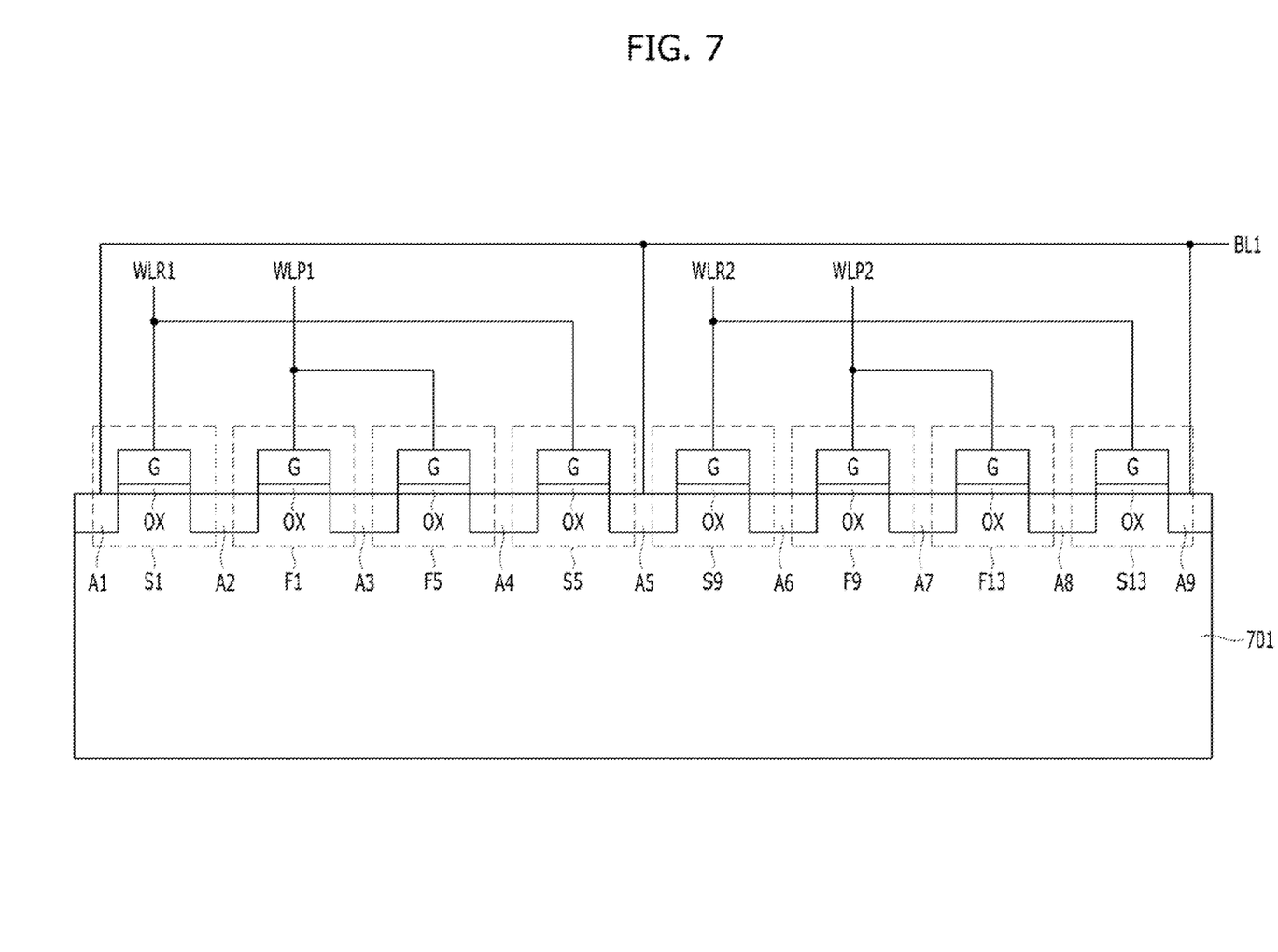
FIG. 7 is a cross-sectional view illustrating transistors coupled to a bit line of the fuse cell array of FIG. 6, which are formed over a substrate.

FIG. 7 is a cross-sectional view illustrating the transistors F1, F5, F9, F13, S1, S5, S9, and S13 among the transistors coupled to the first bit line BL1 of the fuse cell array of FIG. 6, which are formed over a substrate.

Referring to FIG. 7, the transistors F1, F5, F9, F13, S1, S5, S9, and F13 coupled to the bit line BL1 may be formed over the semiconductor substrate 701. The transistors F1, F5, F9, F13, S1, S5, S9, and F13 may include gates G, gate oxide layers OX, and active regions A1 to A9.

Among the transistors, adjacent transistors S1-F1 F1-F5 F5-S5, S5-S9, S9-F9, F9-F13, and F13-S13 may share the active regions A2 to A8. Among the active regions, the active regions A1, A5, and A9 may be coupled to the bit line BL1.

The fuse cell array illustrated in FIGS. 6 and 7 may not require an isolation layer for isolating transistors, and an active region within the fuse cell array may be shared by two transistors. Thus, the area of the fuse cell array may be reduced. Furthermore, since the transistors F1, F5, F9, F13, S1, S5, S9, and S13 have the same shape, unlike the fuse cell circuit illustrated in FIG. 3, the uniformity of the process may be increased to improve the reliability of the circuit.

Figure 8:
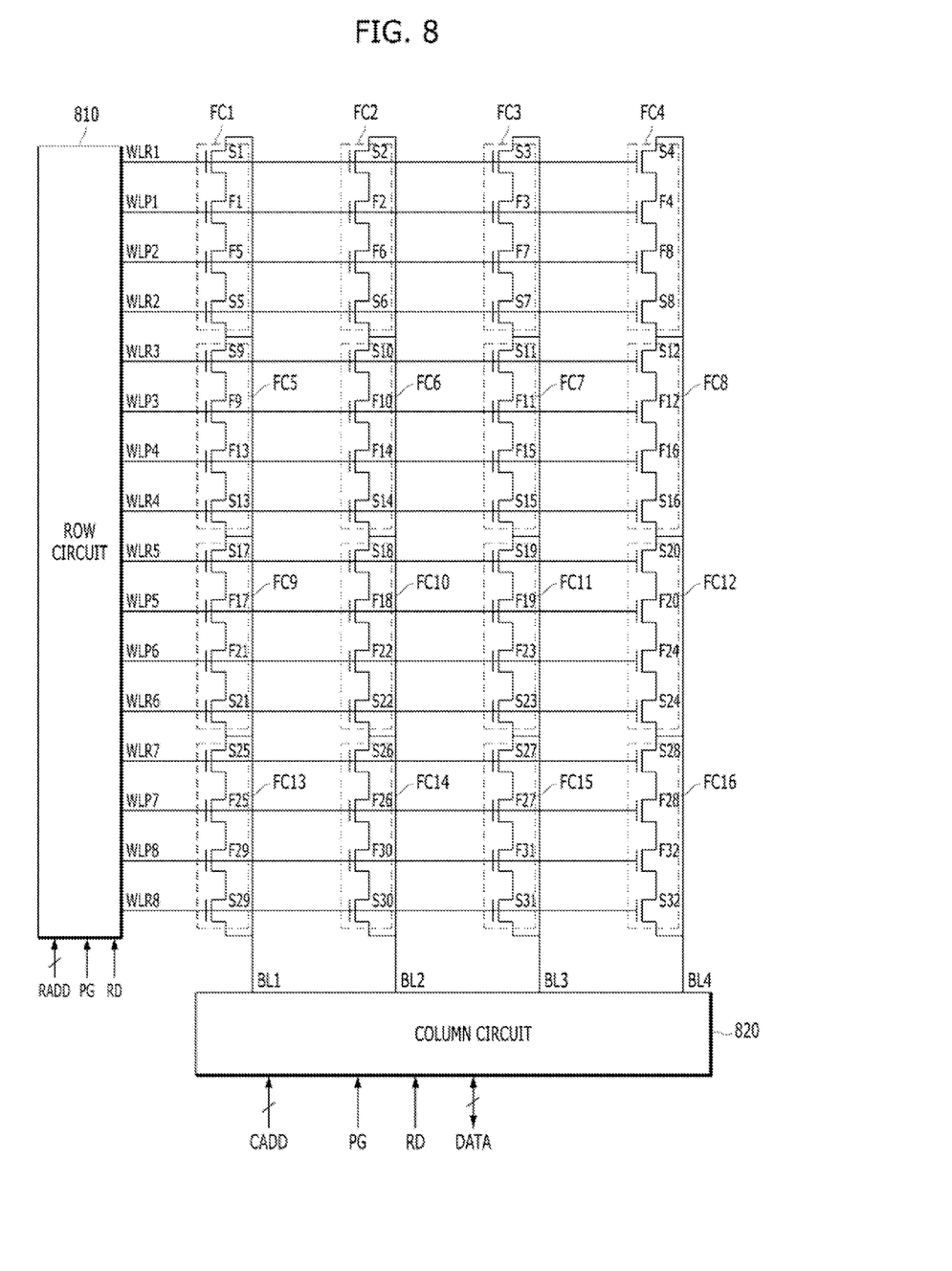
FIG. 8 is a configuration diagram of a fuse cell array in accordance with an embodiment of the present invention.

FIG. 8 is a configuration diagram of a fuse cell array in accordance with an embodiment of the present invention. In the fuse cell array of FIG. 8, each fuse cell may store two-bit data.

Referring to FIG. 8, the fuse cell array may include first to fourth bit lines BL1 to BL4, a plurality of row lines WLR1 to WLR8, a plurality of program/read lines WLP1 to WLP8, and a plurality of fuse cells FC1 to FC16. Each of the fuse cells FC1 to FC16 may have the same configuration as the fuse cell FC of FIG. 4.

In FIG. 8, the select transistors included in each of the fuse cells FC1 to FC16 may be coupled to different row lines, and the fuse transistors included in each of the fuse cells FC1 to FC16 may be coupled to different program read lines. Each of the fuse cells FC1 to FC16 of FIG. 8 may store two-bit data which corresponds to the respective states of two fuse transistors included therein.

Hereafter, it is described as an example that the first row is a selected row and the fourth column is a selected column, that is the fuse transistor F4 of the fuse cell FC4 is selected. The voltages applied to the selected fuse transistor F4 and the unselected other transistors during program and read operations will now be described.

Program Operation

The row line WLR1 of the selected row may be activated, and the other row lines WLR2 to WLR8 may be deactivated. Thus, the select transistors S1 to S4 may be turned on, and the select transistors S5 to S32 may be turned off. At this time, a high voltage may be applied to the program/read line WLP1 of the selected row, and a low-level voltage may be applied to the other program/read lines WLP2 to WLP8.

When input data DATA is first program data (for example, '1'), the selected bit line BL4 may be driven to a low level, and the selected fuse transistor F4 may be programmed with the first program data. Furthermore, when the input data DATA is second program data (for example, '0') the selected bit line BL4 may be driven to a high level, and the selected fuse transistor F4 may be programmed with the second program data. Since the unselected bit lines BL1 to BL3 are floated, the fuse transistors F1, F2, and F3 may not be programmed even though a high voltage is applied to the gates thereof.

Read Operation

The row line WLR1 of the selected row may be activated, and the other row lines WLR2 to WLR8 may be deactivated. Thus, the select transistors S1 to S4 may be turned on, and the select transistors S5 to S32 may be turned off. At this time, a read voltage may be applied to the program/read line WLP1 of the selected row, and a low-level voltage may be applied to the other program/read lines WLP2 to WLP8. When a current flows through the selected bit line B4, the value stored in the fuse transistor F4 may be recognized as the first program data, and when no current flows through the selected bit line BL4, the value stored in the fuse transistor F4 may be recognized as the second program data. The unselected bit lines BL1 to BL3 may be floated.

Figure 9:
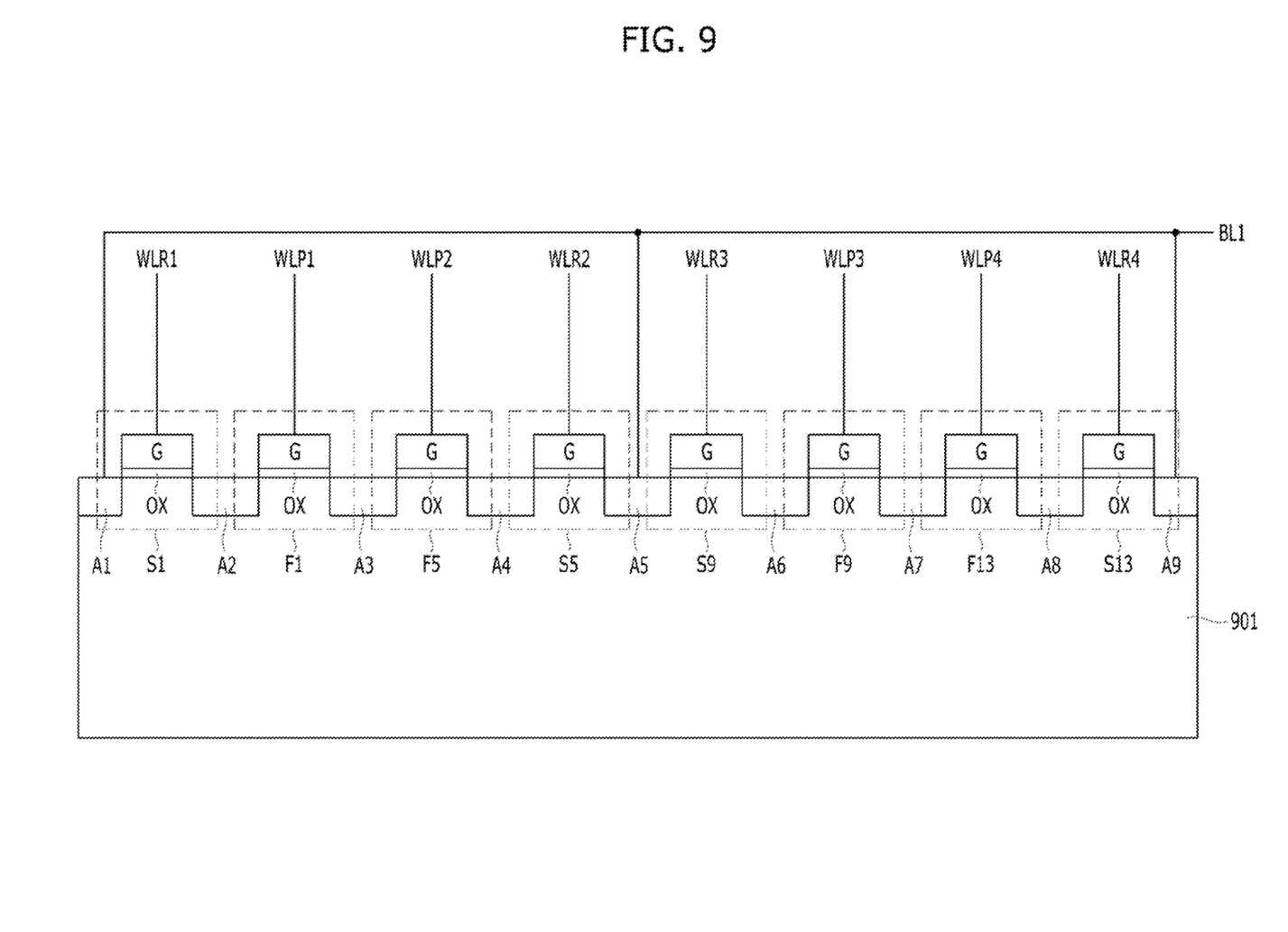
FIG. 9 is a cross-sectional view illustrating transistors coupled to a bit line of the fuse cell array of FIG. 8, which are formed over a substrate.

FIG. 9 is a cross-sectional view illustrating the transistors F1, F5, F9, F13, S1, S5, S9, and S13 among the transistors coupled to the bit line BL1 of the fuse cell array in FIG. 8, which are formed over a substrate.

Referring to FIG. 9, the transistors F1, F5, F9, F13, S1, S5, S9, and F13 coupled to the bit line BL1 may be formed over a semiconductor substrate 901. The transistors F1, F5, F9, F13, S1, S5, S9, and F13 may include gates G, gate oxide layers OX, and active regions A1 to A9.

Among the transistors, adjacent transistors S1-F1, F1-F5, F5-S5, S5-S9 S9-F9, F9-F13 and F13-S13 may share the active regions A2 to A8, respectively. Among the active regions, the active regions A1, A5, and A9 may be coupled to the bit line BL1.

The fuse cell array illustrated in FIGS. 8 and 9 may not require an isolation layer for isolating transistors, and an active region within the fuse cell array may be shared by two transistors. Thus, the area of the fuse cell array may be reduced. Furthermore, since the transistors F1, F5, F9, F13, S1, S5, S9, and S13 have the same shape, unlike the fuse cell circuit illustrated in FIG. 3, the uniformity of the process may be increased to improve the reliability of the circuit.

FIGS. 6 and 8 illustrate that the fuse cell array includes four bit lines and four fuse cells coupled to each of the bit lines, for a simplified description. However, the number of bit lines and the number of fuse cells coupled to each of the bit lines may differ depending on design.

Figure 10:
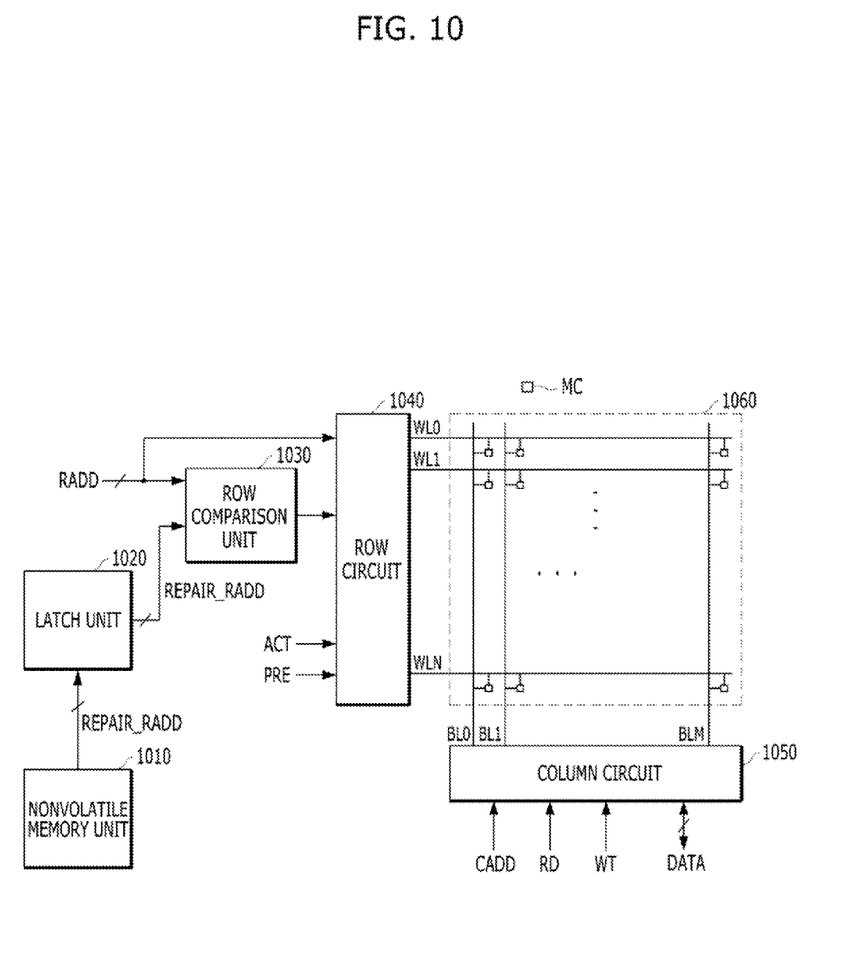
FIG. 10 is a configuration diagram of a semiconductor device in accordance with an embodiment of the present invention.

FIG. 10 is a configuration diagram of a semiconductor device in accordance with an embodiment of the present invention.

Referring to FIG. 10, the memory device may include a nonvolatile memory unit 1010, a latch unit 1020, a row comparison unit 1030, a row circuit 1040, a column circuit 1050, and a memory bank 1060.

The nonvolatile memory unit 1010 may store a row address corresponding to a defective memory cell within the memory bank 1060, as a repair row address. The nonvolatile memory unit 1010 may include the fuse cell array of FIG. 6 or 8. The repair row address may be stored in the fuse cell array.

The latch unit 1020 may receive repair data (repair row address REPAIR_RADD) stored in the nonvolatile memory unit 1010, and store the repair data. The repair data stored in the latch unit 1020 may be used for a redundancy operation. The latch unit 1020 may include latch circuits, and store the repair data only while power is supplied. An operation in which the repair data is transmitted and stored into the latch unit 1020 from the nonvolatile memory unit 1010 may be referred to as a boot-up operation.

The reason that the repair data stored in the nonvolatile memory unit 1010 is not directly used, but transmitted and stored into the latch unit 1020 and then used, is as follows. Since the nonvolatile memory unit 1010 is configured in an array form, a predetermined time is required to call data stored in the nonvolatile memory unit 1010. Since the data cannot be called immediately, it is impossible to perform a redundancy operation by directly using the data stored in the nonvolatile memory unit 1010. Thus, the boot-up operation of transmitting the repair data stored in the nonvolatile memory unit 1010 to the latch unit 1020 may be performed. After the boot-up operation, the data stored in the latch unit 1020 may be used to perform a redundancy operation.

The row circuit 1040 may activate a word line selected by the row address RADD. The row comparison unit 1030 may compare the repair row address REPAIR_RADD stored in the latch unit 1020 to a row address RADD inputted from outside the memory device. When the repair row address REPAIR_RADD and the row address RADD coincide with each other, the row comparison unit 1030 may control the row circuit 1040 to activate a redundancy word line instead of the word line designated by the row address RAID. That is, the row (word line) corresponding to the repair row address REPAIR_RADD stored in the latch unit 1020 may be replaced with the redundancy row (word line). This may indicate that normal cells coupled to a normal row are replaced with redundancy cells coupled to a redundancy row.

The column circuit 1050 may access (read or write) data of a bit line selected through the column address CADD. The memory bank 1060 may include a plurality of word lines WL0 to WLN, a plurality of bit lines BL0 to BLM, and a memory cell MC coupled between each word line and each corresponding bit line.

FIG. 10 illustrates an example in which the repair data stored in the nonvolatile memory unit 1010 is used to replace a word line. However, the repair data may be used as data for replacing a column or memory block.

In FIG. 10, 'ACT' represents a signal for activating a word line, and 'PRE' represents a precharge command, and 'RD' represents a read command, and 'WT' represents a write command.

In accordance with the embodiments of the present invention, as transistors included in a fuse cell share an active region, the area of the circuit may be reduced, and the uniformity of the process may be increased to improve the reliability of the circuit.

Although various embodiments have been described for illustrative purposes, it will be apparent to those skilled in the art that various changes and modifications may be made without departing from the spirit and scope of the invention as defined in the following claims.

What is claimed is:

1. A fuse cell circuit comprising:
   a bit line;
   a first fuse transistor having first and second program states;
   a first select transistor coupled between one terminal of the first fuse transistor and the bit line, and suitable for turning on when the first fuse transistor is selected;
   a second fuse transistor including one terminal coupled to a other terminal of the first fuse transistor, and having the first and second program states; and
   a second select transistor coupled between a other terminal of the second fuse transistor and the bit line, and suitable for turning on when the second fuse transistor is selected,
   wherein the first select transistor, the first fuse transistor, the second fuse transistor and the second select transistor are coupled in series.

2. The fuse cell circuit of claim 1, wherein the fuse cell circuit stores one-bit data depending on the first and second program states of the first and second fuse transistors.

3. The fuse cell circuit of claim 2, wherein the first and second fuse transistors are selected together, and receive the same program voltage.

4. The fuse cell circuit of claim 1, wherein the fuse cell circuit stores a first one-bit data depending on the first and second program states of the first fuse transistor, and stores a second one-bit data depending on the first and second program states of the second fuse transistor.

5. The fuse cell circuit of claim 4, wherein the first and second fuse transistors are separately selected, and receive different program voltages.

6. The fuse cell circuit of claim 1, further comprising:
   a semiconductor substrate doped with a first-type impurity;
   a first active region corresponding to one terminal of the first select transistor, and coupled to the bit line;
   a second active region corresponding to a first node coupled to the first select transistor and the first fuse transistor;
   a third active region corresponding to a second node coupled to the first fuse transistor and the second fuse transistor;
   a fourth active region corresponding to a third node coupled to the second fuse transistor and the second select transistor; and
   a fifth active region corresponding to one terminal of the second select transistor, and coupled to the bit line,
   wherein the first to fifth active regions are formed by doping the semiconductor substrate with a second-type impurity.

7. A fuse cell array comprising:
   a plurality of bit lines; and
   a plurality of fuse cells each having both ends coupled to a corresponding bit line among the bit lines,
   wherein each of the fuse cells comprises:
   a first fuse transistor having first and second program states;
   a first select transistor coupled between one terminal of the first fuse transistor and the bit line, and suitable for turning on when the first fuse transistor is selected;
   a second fuse transistor including one terminal coupled to a other terminal of the first fuse transistor, and having the first and second program states; and
   a second select transistor coupled between a other terminal of the second fuse transistor and the bit line, and suitable for turning on when the second fuse transistor is selected,
   wherein the first select transistor, the first fuse transistor, the second fuse transistor and the second select transistor are coupled in series.

8. The fuse cell array of claim 7, wherein each of the fuse cells stores one-bit data depending on the first and second program states of the first and second fuse transistors.

9. The fuse cell array of claim 8, further comprising:
   a plurality of row lines suitable for turning on/off select transistors of the fuse cells; and
   a plurality of program/read lines suitable for programming fuse transistors of the fuse cells or reading data thereof,
   wherein in each of the fuse cells, the first and second fuse transistors are coupled to a same program/read line among the plurality of program/read lines, and the first and second select transistors are coupled to a same row line among the plurality of row lines.

10. The fuse cell array of claim 7, wherein each of the fuse cells stores a first one-bit data depending on the first and second program states of the first fuse transistor, and stores a second one-bit data depending on the first and second program states of the second fuse transistor.

11. The fuse cell array of claim 10, further comprising:
    a plurality of row lines suitable for turning on/off select transistors of the fuse cells; and
    a plurality of program/read lines suitable for programming fuse transistors of the fuse cells or reading data thereof,
    wherein in each of the fuse cells,
    the first and second fuse transistors are coupled to different program/read lines among the plurality of program/read lines, and the first and second select transistors are coupled to different row lines among the plurality of row lines.

12. The fuse cell array of claim 7, further comprising:
    a semiconductor substrate doped with a first-type impurity,
    wherein each of the fuse cells comprises:
    a first active region corresponding to one terminal of the first select transistor, and coupled to the bit line;
    a second active region corresponding to a first node coupled to the first select transistor and the first fuse transistor;
    a third active region corresponding to a second node coupled to the first fuse transistor and the second fuse transistor;
    a fourth active region corresponding to a third node coupled to the second fuse transistor and the second select transistor; and a fifth active region corresponding to one terminal of the second select transistor, and coupled to the bit line,
wherein the first to fifth active regions are formed by doping the semiconductor substrate with a second-type impurity.

* * * * *